United States Patent
Onodera et al.

(10) Patent No.: US 7,458,151 B2
(45) Date of Patent: Dec. 2, 2008

(54) METHOD OF FORMING EXTERNAL ELECTRODE

(75) Inventors: Ko Onodera, Tokyo (JP); Satoshi Kurimoto, Tokyo (JP); Yoji Tozawa, Tokyo (JP); Seiichi Nakagawa, Tokyo (JP)

(73) Assignee: TDK Corporation, Tokyo (JP)

( * ) Notice: Subject to any disclaimer, the term of this patent is extended or adjusted under 35 U.S.C. 154(b) by 265 days.

(21) Appl. No.: 11/288,203

(22) Filed: Nov. 29, 2005

(65) Prior Publication Data

US 2006/0112546 A1 Jun. 1, 2006

(30) Foreign Application Priority Data

Nov. 30, 2004 (JP) ............................ P2004-347049

(51) Int. Cl.
*H01R 43/00* (2006.01)
*H05K 3/30* (2006.01)
*H01G 2/20* (2006.01)

(52) U.S. Cl. .............................. 29/879; 29/825; 29/832; 29/840; 29/854; 29/884; 361/308.1

(58) Field of Classification Search ................ 29/602.1, 29/25.41–25.42, 746, 825, 832, 854, 840, 29/874–879, 884; 361/308.1, 309, 321.2; 338/22 R, 314, 322

See application file for complete search history.

(56) References Cited

U.S. PATENT DOCUMENTS 4,590,537 A * 5/1986 Sakamoto ................ 361/306.3
4,788,931 A 12/1988 Nitta et al.
5,753,299 A * 5/1998 Garcia et al. ................ 427/76
6,270,613 B1 * 8/2001 Nakagawa et al. .......... 156/235
6,322,855 B1 11/2001 Liao

FOREIGN PATENT DOCUMENTS

| JP | A-6-077099 | 3/1994 |
| JP | A-09-022815 | 1/1997 |
| JP | A 2000-030916 | 1/2000 |
| JP | A-2001-060532 | 3/2001 |
| JP | A 2002-151367 | 5/2002 |
| JP | A-2004-088068 | 3/2004 |
| JP | A-2004-311761 | 11/2004 |
| TW | 429169 | 4/2001 |

* cited by examiner

*Primary Examiner*—Peter DungBa Vo
*Assistant Examiner*—David P Angwin
(74) *Attorney, Agent, or Firm*—Oliff & Berridge, PLC

(57) ABSTRACT

The object of the invention is to provide a method of forming an external electrode of an electronic component whereby the external electrode can be formed in a stable fashion. In order to achieve this object, a method of forming an external electrode according to the present invention includes: a step of forming an electrode portion 301*a* on a side face 30*a* of a chip 30 constituting an electronic component by applying a conductive paste 20 from a direction facing this side face 30*a*; a step of forming an electrode portion 301*b* on a side face 30*b* of the chip 30 facing the side face 30*a* by applying the conductive paste 20 from a direction facing this side face 30*b*; a step of forming an electrode portion 301*c* so as to connect the electrode portion 301*a* and electrode portion 301*b* on the bottom face of the chip 30 respectively adjacent to the side face 30*a* and the side face 30*b*; and a step of forming an external electrode 301 comprising the electrode portion 301*a*, electrode portion 301*b* and electrode portion 301*c* by drying this chip 30.

4 Claims, 8 Drawing Sheets

(A)

(B)

(C)

(D)

(A)

(B)

(C)

(D)

(E)

(A)

(B)

METHOD OF FORMING EXTERNAL ELECTRODE

BACKGROUND OF THE INVENTION

1. Field of the Invention

The present invention relates to a method of forming an external electrode of an electronic component.

2. Related Background Art

One method of forming an external electrode of an electronic component is the method set out in U.S. Pat. No. 5,753,299. This method is a method of forming an external electrode on the end face of a chip which is an element constituting an electronic component and on the side face adjacent to this end face. More specifically, continuous projecting portions called fingers of a comb-shaped plate are arranged in a position facing the side face of the chip and conductive paste for forming an external electrode is applied to the tips of these fingers. An external electrode is then formed by rubbing conductive paste onto the chip by bringing the fingers into contact with the chip and sliding the fingers in a direction intersecting the direction of extension of the chip.

SUMMARY OF THE INVENTION

As described above, when an external electrode is formed by rubbing conductive paste onto the end face of the chip, the external electrode that is formed on the side face is formed by hanging down of conductive paste. More specifically, the conductive paste sliced off and falling from the edge defined by the end face and side face flows along the side face of the chip, thereby forming an external electrode on the side face. Consequently, the shape of the external electrode formed on the side face of the chip is controlled by the viscosity and other properties of the conductive paste. However, since it is difficult to freely control the viscosity of the conductive paste, it is difficult to control the length of the external electrode on the side face of the chip in the direction departing from the edge by adjusting the viscosity of the conductive paste.

The present inventors therefore studied from various aspects the possibility of controlling the length of the external electrode by a method that should not depend on adjustment of the viscosity of the conductive paste. As an initial step in these studies, the present inventors studied whether it might be possible to control the length of the external electrode by adjusting the quantity of conductive paste sliced off and falling from the edge defined by the end face and side face of the chip. However, the present inventors discovered that, if the amount of conductive paste is increased, although the extension of the external electrode on the side face of the chip in the direction departing from the edge along the end face is increased, the extension thereof in the direction along the edge is also inevitably increased. As a result of this discovery, they realized that the separation between adjacent external electrodes would be insufficient, with a risk of inter-electrode shorting.

In the next step in their studies, the present inventors discovered that, if the amount of conductive paste was decreased in order to ensure an adequate distance between the adjacent external electrodes, decrease in the amount of conductive paste hanging down from the edge gave rise to the risk that extension of the external electrodes in the direction departing from the edge might be restricted and that sufficient area of the external electrode might not be ensured. As a result of further study, the present inventors also discovered that, when external electrodes were formed in this way by conductive paste being sliced off and falling from the edge, the condition of the external electrodes on the side face was governed by the way in which the conductive paste hung down; thus the shape of the external electrodes was sometimes unstable. This was a factor giving rise to the Manhattan phenomenon when mounted on a substrate.

Accordingly, an object of the present invention is to provide a method of forming an external electrode of an electronic component wherein the external electrode can be formed in stable fashion.

In order to achieve the above object, a method of forming an external electrode of an electronic component according to the present invention comprises: a first forming step of forming a first electrode portion on a first face of an element constituting an electronic component by applying a conductive paste from a direction facing this first face; a second forming step of forming a second electrode portion on a second face of the element facing the first face by the applying conductive paste from a direction facing this second face; a third forming step of forming a third electrode portion so as to connect the first electrode portion and second electrode portion on a third face of the element respectively adjacent to the first face and the second face; and an electrode forming step of forming an external electrode comprising the first electrode portion, second electrode portion and third electrode portion by drying this element.

Since, according to the present invention, conductive paste is applied from directions facing the respective faces respectively to the first face and second face of the element, a first electrode portion and second electrode portion can be stably formed in the intended shape on the respective faces. Also, since the third electrode portion is formed so as to connect these after formation of the first electrode portion and second electrode portion, an external electrode can be formed in stable fashion.

A method of forming an external electrode of an electronic component according to the present invention comprises: a first forming step of forming a first electrode portion on a first face of an element constituting an electronic component by applying a conductive paste from a direction facing this first face; a second forming step of forming a second electrode portion on a second face of the element facing the first face by applying the conductive paste from a direction facing this second face; an intermediate processing step of decreasing the fluidity of the conductive paste in the first electrode portion and second electrode portion by drying the element; a third forming step of forming a third electrode portion so as to connect the first electrode portion and second electrode portion on a third face of the element respectively adjacent to the first face and the second face; and an electrode forming step of forming an external electrode comprising the first electrode portion, second electrode portion and third electrode portion by drying this element.

Since, according to the present invention, conductive paste is applied from directions facing the respective faces respectively to the first face and second face of the element, a first electrode portion and second electrode portion can be stably formed in the intended shape on the respective faces. Also, since the third electrode portion is formed after decreasing the fluidity of the conductive paste in the first electrode portion and second electrode portion, reduction in thickness of the portions that connect the third electrode portion respectively with the first electrode portion and second electrode portion can be suppressed.

Also, preferably, a method of forming an external electrode according to the present invention further comprises a preparatory step of preparing a jig having a groove capable of insertion of the element and filling the interior of the groove of the jig with conductive paste, and a removal step of causing the conductive paste with which filling is performed to remain along at least the wall face of the groove and removing the residue; wherein, in the first forming step, the element is inserted in the groove and a first electrode portion is formed by moving the element such that the first face thereof approaches one wall face of the groove and, in the second forming step, a second electrode portion is formed by moving the element such that a second face thereof approaches the other wall face of the groove.

With this preferred method, the first electrode portion and second electrode portion can be formed in a more convenient and stable fashion by depositing on the element the conductive paste remaining along the wall face of the groove capable of insertion of an element.

Also, in a method of forming an external electrode according to the present invention, preferably, in the first forming step, first electrode portions are formed juxtaposed in a plurality of locations on the first face and, in the second forming step, second electrode portions are formed in positions respectively corresponding to the first electrode portions formed juxtaposed in the plurality of locations and, in the third forming step, third electrode portions are formed so as to connect with the respective first electrode portions formed juxtaposed in the plurality of locations and so as to connect with the respective second electrode portions formed in the corresponding positions.

With this preferred method, since the first electrode portions and second electrode portions are formed in juxtaposed fashion in a plurality of locations in correspondence and the third electrode portions are formed so as to connect with the corresponding first electrode portions and second electrode portions, the external electrodes can be formed in an efficient and stable fashion.

Also, preferably, a method of forming an external electrode according to the present invention further comprises a preparatory step of preparing a jig in which a plurality of plate-shaped members formed with grooves capable of insertion of an element are arranged alongside each other and filling the interior of the respective grooves with conductive paste so as to span and cover the respective grooves of the plurality of plate-shaped members; and a removal step of removing the conductive paste introduced between the respective plurality of plate-shaped members, to cause the conductive paste that is introduced into the respective grooves to remain along at least the wall face of the respective grooves; wherein, in the first forming step, the element is inserted across the respective grooves and the first electrode portions are formed by moving the element such that the first face thereof approaches one wall face of the respective grooves; and, in the second forming step, the second electrode portions are formed by moving the element such that the second face thereof approaches the other wall face of the respective grooves.

With this preferred method, excess conductive paste with which the respective grooves are filled is allowed to flow out by filling the grooves of the plurality of plate-shaped members arranged alongside each other with conductive paste and then removing the conductive paste between the plurality of plate-shaped members. Consequently, conductive paste can remain along the wall faces of the respective grooves of the plurality of plate-shaped members.

With the present invention as described above, external electrodes can be formed in stable fashion since the first electrode portions, second electrode portions and third electrode portions can be formed in stable fashion.

BRIEF DESCRIPTION OF THE DRAWINGS

The present invention may be more readily described with reference to the accompanying drawings, in which.

DESCRIPTION OF THE PREFERRED EMBODIMENTS

The discovery of the present invention can easily be understood by considering the following detailed description with reference to the appended drawings, which are given solely by way of example. Embodiments of the present invention will now be described with reference to the appended drawings. Where possible, identical portions are given the same reference symbols and duplication of description is dispensed with.

Figure 1:
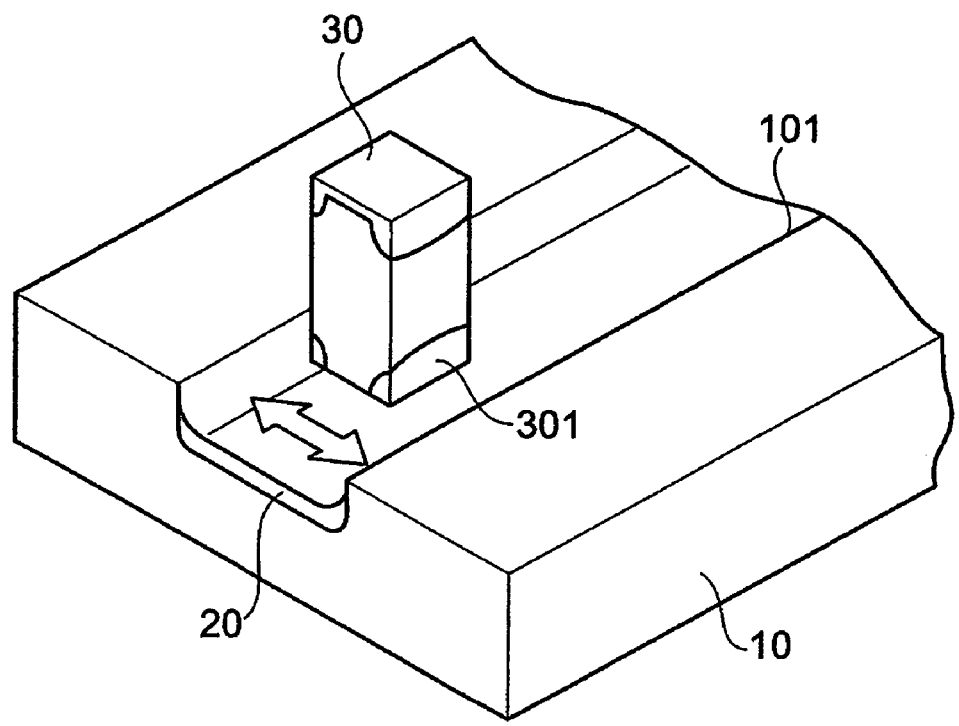
FIG. 1 is a perspective view showing an outline of a method of forming an external electrode according to a first embodiment of the present invention.

(First embodiment) A method of forming an external electrode constituting a first embodiment of the present invention will now be described. As shown in FIG. 1, an outline of the method of forming an external electrode according to this embodiment is that a conductive paste application bed 10 (jig) is prepared that is formed with a groove 101 and conductive paste 20 is deposited thereon along the wall faces and bottom faces of this groove 101. After this, a chip 30 (element) is inserted into the groove 101 and external electrodes 301 are formed on both side faces of the chip 30 by moving the chip 30 along the direction of the arrow in the Figure (direction orthogonal to the direction of extension of the groove). Next, a method of forming external electrodes will be described in detail.

Figure 2:
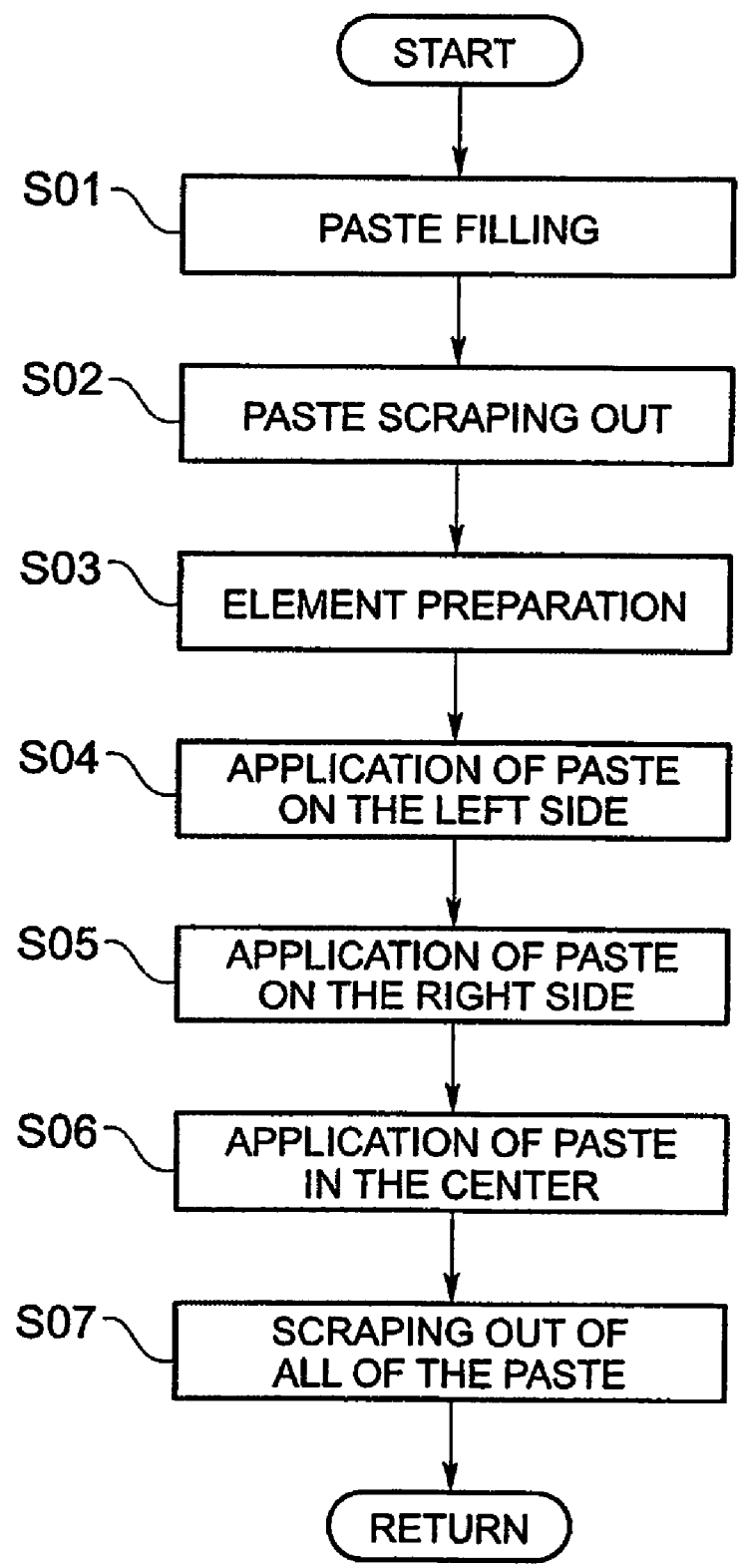
FIG. 2 is a view showing a method of forming an external electrode according to a first embodiment of the present invention.
Figure 3:
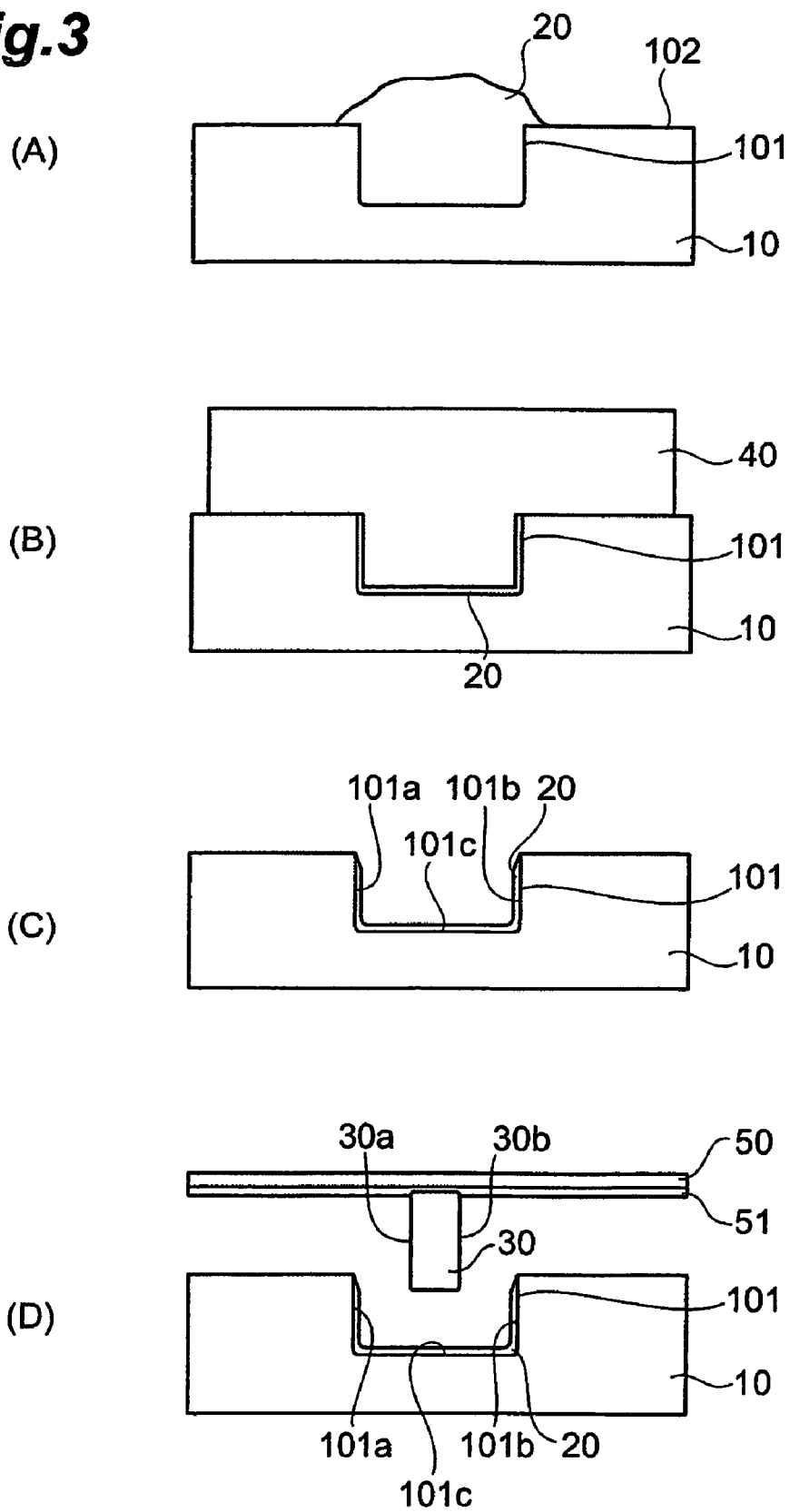
FIG. 3 is a view given in explanation of a method of forming an external electrode according to a first embodiment of the present invention.
Figure 4:
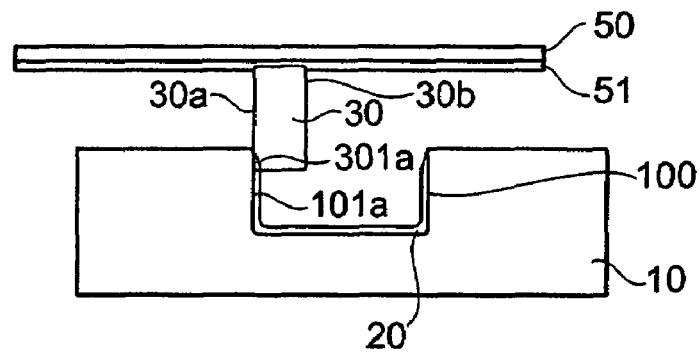
FIG. 4 is a view given in explanation of a method of forming an external electrode according to a first embodiment of the present invention.
Figure 4:
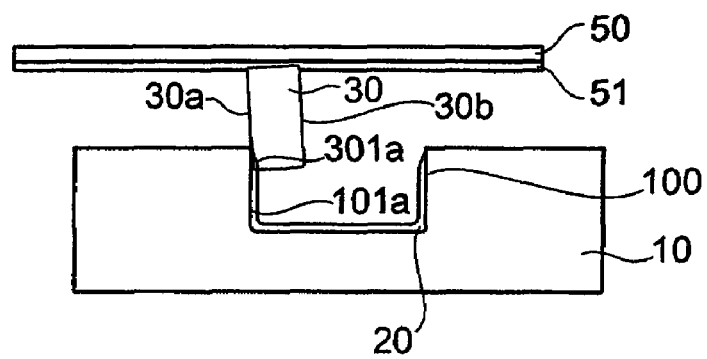
Figure 4:
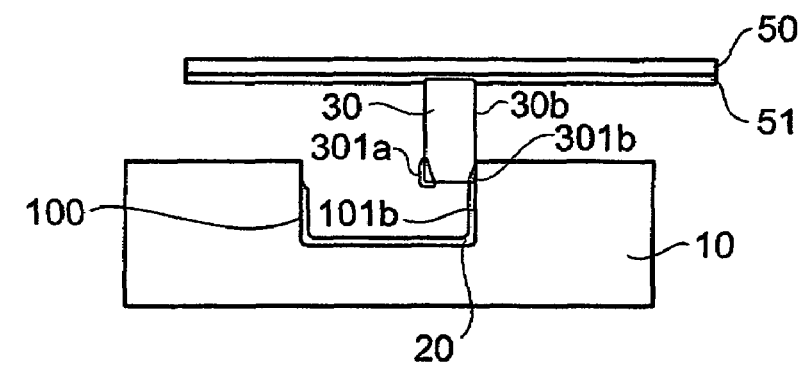
Figure 4:
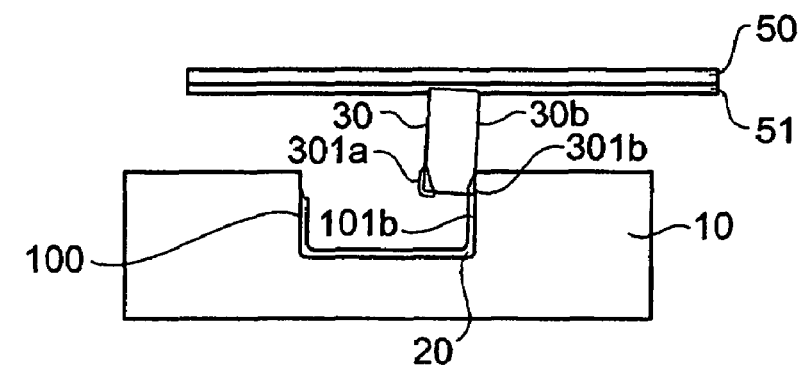
Figure 5:
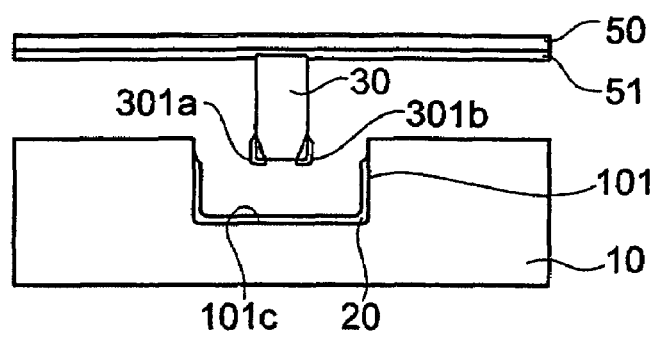
FIG. 5 is a view given in explanation of a method of forming an external electrode according to a first embodiment of the present invention.
Figure 5:
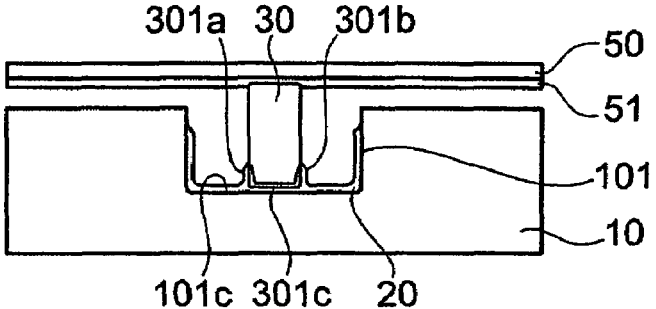
Figure 5:
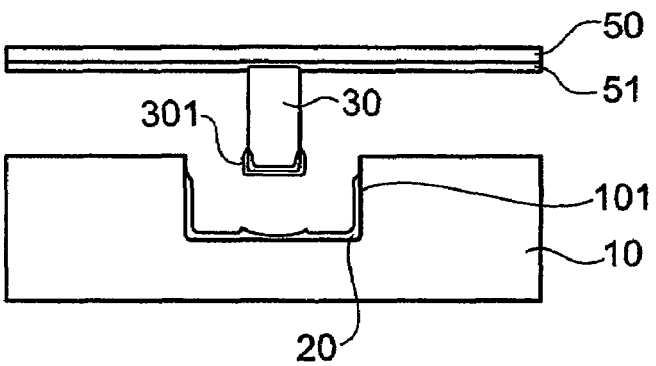
Figure 5:
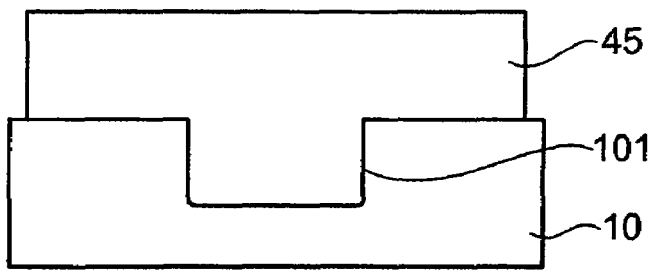
Figure 5:
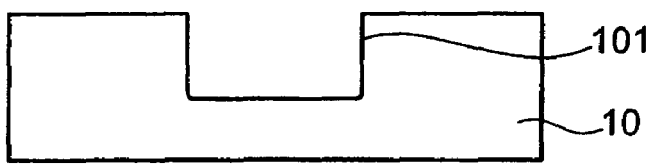

FIG. 2 is a view given in explanation of the sequence of the method of forming an external electrode according to the present embodiment. FIG. 3 to FIG. 5 are views of the chip 30 and application bed 10 seen from the direction looking through the groove 101, being views showing the condition in the various steps of the method of forming an external electrode. The flow shown in FIG. 2 will now be described referring as appropriate to FIG. 3 to FIG. 5.

The groove 101 of the application bed 10 is filled with conductive paste 20 (step S01 in FIG. 2, FIG. 3(A), preparatory step). As shown in FIG. 3(A), the groove 101 is filled with conductive paste 20 and filling is performed to such a degree that the conductive paste rises above the main face 102 of the application bed 10.

Next, the conductive paste in the groove 101 is scraped out using a blade 40 (step S02 in FIG. 2, FIG. 3(B), removal step). As shown in FIG. 3(B), the blade 40 is of convex shape so as to enter the groove 101, so that a gap is formed between the blade 40 and the groove 101 corresponding to the portion thereof that enters the groove 101. Consequently, as shown in FIG. 3(C), conductive paste 20 remains along the side walls 101a, 101b and bottom face 101c of the groove 101, while the residue is removed.

Next, the tip of the chip 30 is arranged in a position inserted into the groove 101 in a position in which the chip 30 faces the groove 101 (step S03 in FIG. 2, FIG. 3(D)). The length of the chip 30 that enters the groove 101 is a length corresponding to the electrode portion that is formed in the subsequent steps. The chip 30 is held by being stuck to tacky adhesive tape 51 provided on a holding plate 50.

From the condition of FIG. 3(D), the holding plate 50 and the application bed 10 are relatively moved (step S04 in FIG. 2 and FIG. 4(A)) such that the side face (first face) 30a of the chip 30 approaches the side wall 101a of the groove 101. When the holding plate 50 and application bed 10 are relatively moved in this way, the side face 30a of the chip comes into abutment with the side face 101a of the groove 101 (FIG. 4(A)).

When the holding plate 50 and the application bed 10 are further relatively moved, as shown in FIG. 4(B), a condition is produced in which the chip 30 is stuck in the groove 101 and the chip 30 is in fact. tilted. In this way, even in the case of an operation to juxtapose a plurality of chips 30 along the groove 101, the chips 30 can be precisely brought into contact with the side wall 101a of the groove 101.

By producing the conditions as shown in FIG. 4(A) and (B), an electrode portion 301a (first electrode portion) is formed (first forming step) on the side face 30a of the chip 30.

Next, the holding plate 50 and the application bed 10 are relatively moved (step S05 in FIG. 2, FIG. 4(C)) such that the side face (second face) 30b of the chip 30 approaches the side 101b of the groove 101. When the holding plate 50 and the application bed 10 are relatively moved in this way, the side face 30b of the chip abuts the side wall 101b of the groove 101 (FIG. 4(C)).

When the holding plate 50 and the application bed 10 are further relatively moved, as shown in FIG. 4(D), the chip 30 assumes a condition in which it is stuck in the groove 101 and the chip 30 thus assumes a tilted condition.

By putting the chip in the conditions of FIG. 4(C) and (D), an electrode portion 301b (second electrode portion) is formed on the side face 30b of the chip 30 (second forming step).

Next, the holding plate 50 and the application bed 10 are relatively moved (FIG. 5(A)) such that the chip 30 is positioned in the vicinity of the center of the groove 101. From this position, the holding plate 50 and the application bed 10 are brought together (FIG. 5(B)) such that the tip of the chip 30 abuts the bottom face 101c (third face) of the groove 101. When the tip of the chip 30 abuts the bottom face 101c of the groove 101, an electrode portion 301c (third electrode portion) connecting the electrode portion 301a and the electrode portion 301b is formed (step S06 of FIG. 2, third forming step).

Next, when the holding plate 50 and the application bed 10 are separated and the chip 30 is dried, an external electrode 301 is formed (FIG. 5(C), electrode forming step) connecting the electrode portion 301a, electrode portion 301b and electrode portion 301c. It should be noted that, although, in this embodiment, the chip 30 is dried after formation of the electrode portion 301c, it would also be possible to perform drying (intermediate processing step) after the formation of the electrode portion 301b but prior to the formation of the electrode portion 301c. In this way, since the electrode portion 301c is formed after lowering the fluidity of the electrode portions 301a and 301b, it is possible to suppress thinning of the angle whereby the electrode portion 301a and electrode portion 301c are connected and/or thinning of the angle whereby the electrode portion 301b and electrode portion 301c are connected.

Next, the conductive paste in the groove 101 is scraped out using the blade 45 (step S07 in FIG. 2, FIG. 5(D)). As shown in FIG. 5(D), the blade 45 is of convex shape so as to enter the groove 101. The difference with respect to the blade 40 shown in FIG. 3(d) is that the blade 45 is formed so that no gap is produced between the groove 101 and the portion of this blade 45 that enters the groove 101. Consequently, as shown in FIG. 5(E), all of the conductive paste within the groove 101 is scraped out.

As described above, in this embodiment, since conductive paste 20 is applied to the respective side faces 30a, 30b of the chip 30 from the direction facing these respective faces, the electrode portion 301a and electrode portion 301b can be formed in the desired shape in stable fashion on these respective faces. Also, since the electrode portion 301c is formed after formation of the electrode portion 301a and electrode portion 301b so as to connect these, the external electrode 301 can be formed in stable fashion.

Also, in this embodiment, by depositing the conductive paste 20 that remains along the wall faces of the groove 101 that is capable of insertion of the chip 30 on the chip 30 the electrode portion 301a and electrode portion 301b can be formed in a more convenient and stable fashion.

Figure 6:
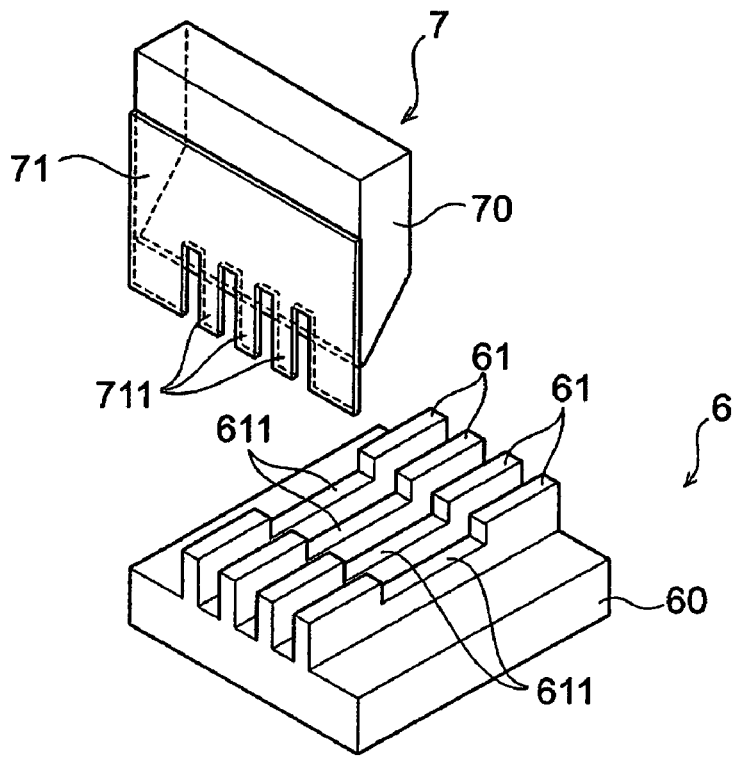
FIG. 6 is a view given in explanation of a method of forming an external electrode according to a second embodiment of the present invention.
Figure 6:
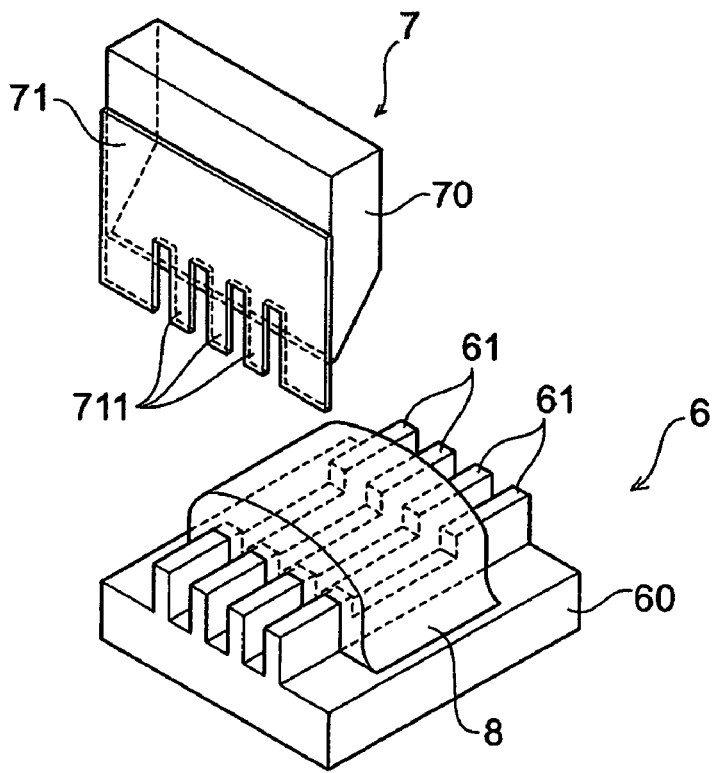
Figure 7:
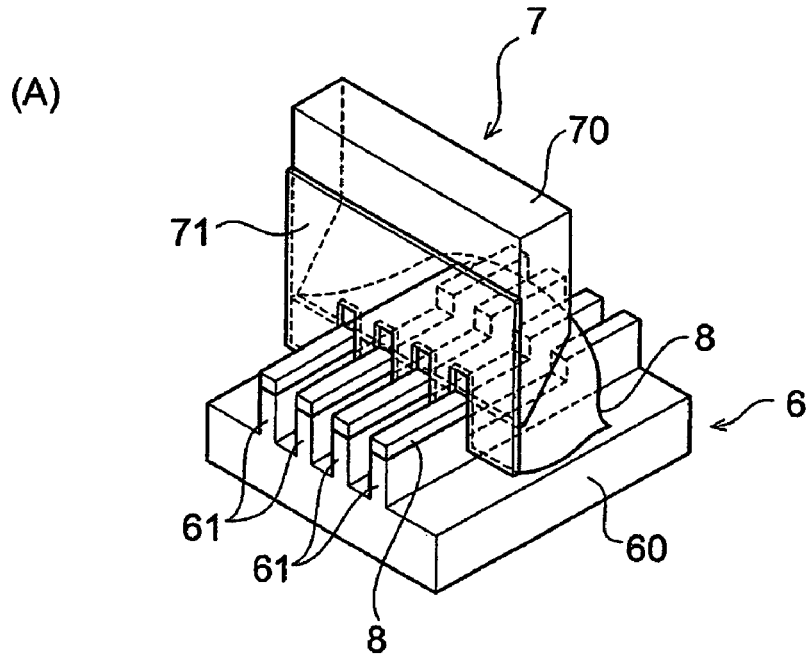
FIG. 7 is a view given in explanation of a method of forming an external electrode according to a second embodiment of the present invention.
Figure 7:
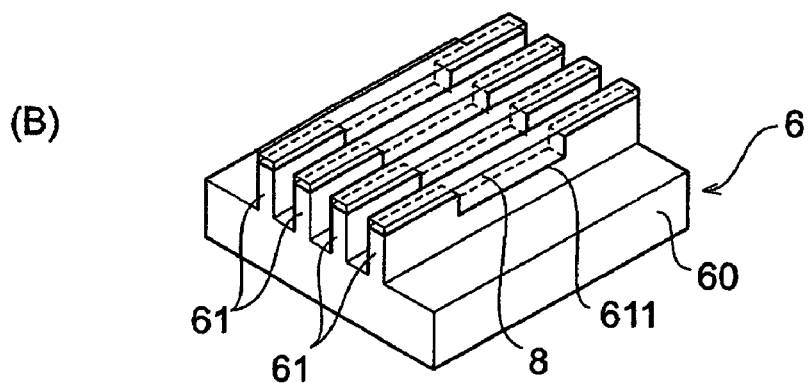
Figure 7:
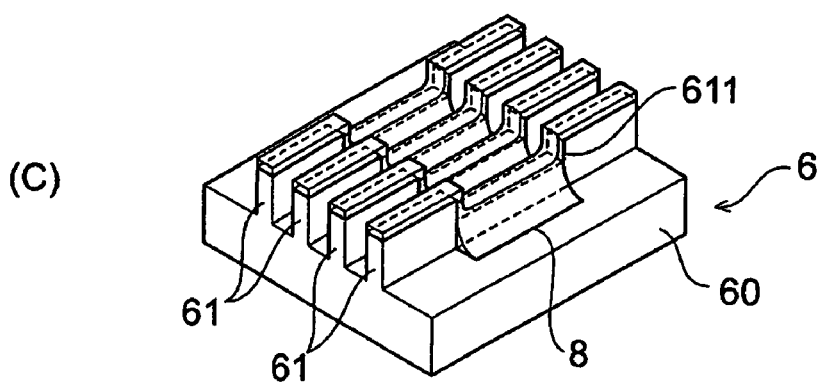
Figure 8:
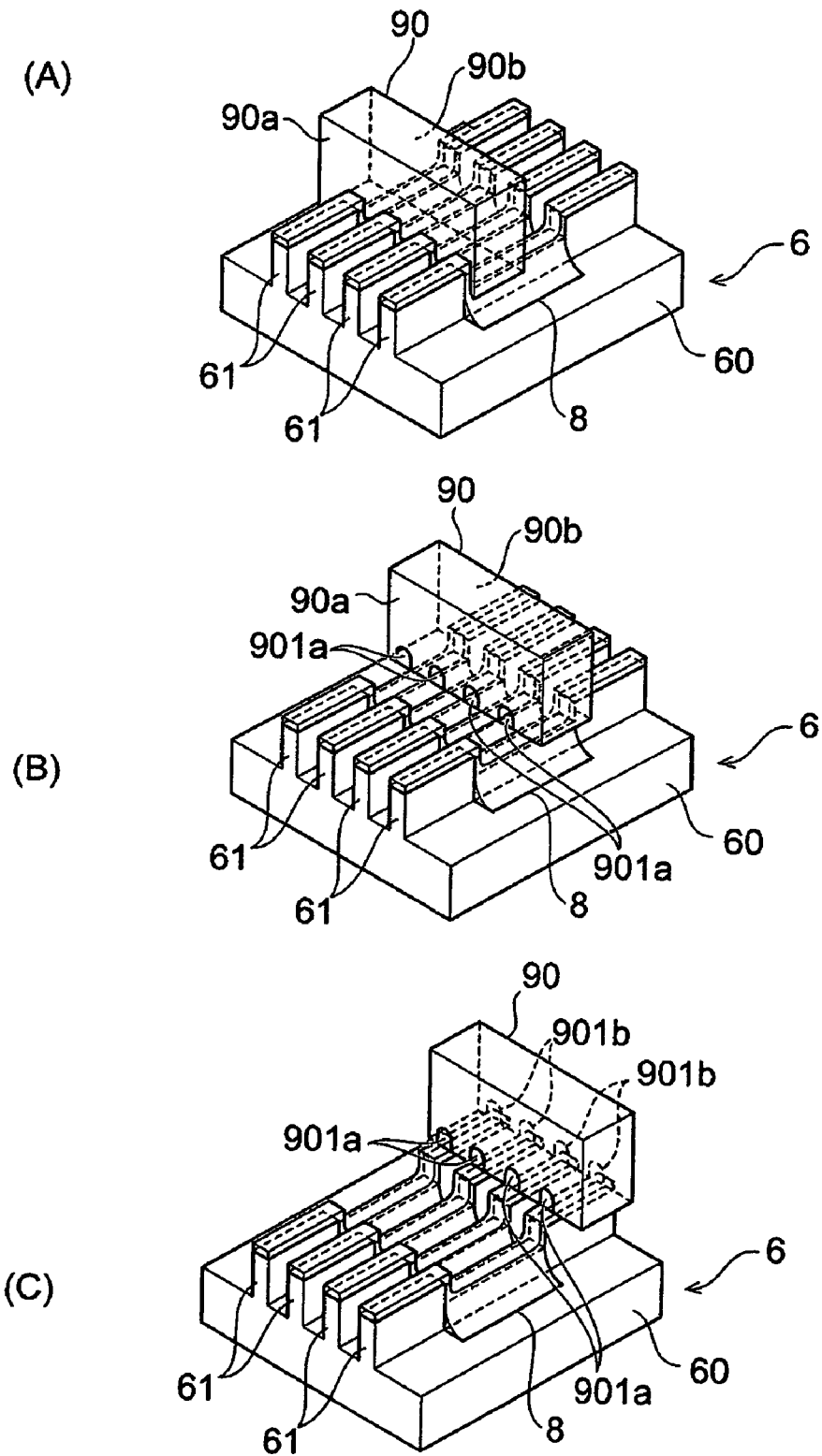
FIG. 8 is a view given in explanation of a method of forming an external electrode according to a second embodiment of the present invention.

(Second embodiment) A method of forming an external electrode according to a second embodiment of the present invention will now be described. The method of forming an external electrode according to this embodiment is a method wherein a plurality of external electrodes are simultaneously formed on a chip. The differences with respect to the first embodiment lie chiefly in the form of the application bed, constituting a jig, that is used and/or the blade. FIG. 6 to FIG. 8 are views given in explanation of the sequence of this method of forming an external electrode according to this embodiment. The method of forming an external electrode according to this embodiment will now be described with reference to FIG. 6 to FIG. 8.

First of all, an application bed 6 and blade 7 are prepared (FIG. 6(A)). The application bed 6 comprises a base 60 and four plate-shaped members 61. The plate-shaped members 61 are mounted on the base 60 so as to be mutually parallel, with a separation therebetween. Grooves 611 are formed in the same position in the respective plate-shaped members 61.

The blade 7 comprises a base 70 and a scraping section 71. The scraping section 71 is formed with teeth 711. The teeth 711 are formed so as to enter between the plate-shaped members 61 of the application bed 6.

Next, conductive paste 8 is piled up (FIG. 6(B)) so as to span and cover the respective grooves 611 of the plate-shaped members 61 of the application bed 6. The grooves 611 of the plate-shaped members 61 are thereby filled with conductive paste 8 (preparatory step).

Next, the blade 7 and application bed 6 are relatively moved (FIG. 7(A)) such that the blade 7 and application bed come into abutment. When movement is carried out in this way, the respective teeth 711 of the blade 7 are inserted between the respective plate-shaped members 61 of the application bed 6. The tips of the teeth 711 are formed such that, in a condition in which they abut the base 60 of the application bed 6, gaps are formed between the top ends of the plate-shaped members 61 and the roots between the teeth 711. The conductive paste 8 is therefore extruded onto the plate-shaped members 61 from these gaps.

Next, the conductive paste 8 that was introduced between the plate-shaped members 61 is scraped out (FIG. 7(B), removal step) by moving the blade 7 along the plate-shaped members 61. Since the conductive paste 8 is fluid, the conductive paste 8 remaining in the grooves 611 of the plate-shaped members 61 flows out (FIG. 7(C)) between the plate-shaped members 61. Consequently, conductive paste 8 remains along the grooves 61 1. of the plate-shaped members 61.

Next, the chip 90 is arranged across the grooves 611 of the respective plate-shaped members 61. At this point, the tips of the chip 90 are arranged in positions inserted into the grooves 611. The length of insertion of the chip 90 into the grooves 611 is the length of the electrode portions. Just as in the case of the first embodiment, the chip 90 is held by being stuck onto tacky adhesive tape (not shown) provided on a holding plate (not shown).

Next the chip 90 and the application plate 60 are relatively moved (FIG. 8(A)) such that the side faces 90a of the chip 90 come into abutment with the grooves 611 of the plate-shaped members 61. The four electrode portions 901a (first electrode portions) are formed (first forming step) by bringing the side faces 90a of the chip 90 into abutment with the respective grooves 611 of the four plate-shaped members 61.

Next the chip 90 and the application bed 60 are relatively moved (FIG. 8(B)) such that the side faces 90b of the chip 90 come into abutment with the grooves 611 of the plate-shaped members 61. The four electrode portions 901b (second electrode portions) are formed (second forming step) by bringing the side faces 90b of the chip 90 into abutment with the respective grooves 611 of the four plate-shaped members 61.

Next, the chip 90 and the application bed 6 are relatively moved (vertical direction in the Figure) so as to be mutually separated. In addition, the chip 90 and the application bed are relatively moved such that the chip 90 is positioned above the portion of the plate-shaped members 61 that is not provided with grooves 611. After this, the chip 90 and the application bed 6 are relatively moved (FIG. 8(C)) such that the chip 90 abuts the portion of the plate-shaped members 61 that is not provided with grooves 611. When the tips of the chip 90 come into abutment with the portion of the plate-shaped members 61 that is not provided with grooves 611, the electrode portions (third electrode portions, not explicitly shown in FIG. 8) that connect the electrode portions 901a and, electrode portions 901b are formed (third forming step).

Next, when the chip 90 and the application bed 6 are moved away from each other and the chip 90 is dried, the external electrodes are formed (electrode forming step) by connection of the electrode portion 901a, electrode portion 901b and the electrode portions that connect the electrode portion 901a and electrode portion 901b.

As described above, in this embodiment, the electrode portions 901a and electrode portions 901b can be formed in a stable fashion in the intended shape on the respective faces by the application of conductive paste 8 from a direction facing the respective faces to the respective side faces 90a, 90b of the chip 90. Also, the external electrode can be formed in stable fashion, after formation of the electrode portion 901a and electrode portion 901b, by formation of the electrode portion so as to connect these.

Also, in this embodiment, thanks to the formation of the corresponding electrode portions 901a and electrode portions 901b in correspondence, juxtaposed in a plurality of locations, the external electrodes can be formed in efficient and stable fashion by the formation of electrode portions so as to connect these corresponding electrode portions 901a and electrode portions 901b.

Also, in this embodiment, by filling the grooves 611 of the plurality of plate-shaped members 61 that are arranged alongside each other with conductive paste 8 and then removing the conductive paste 8 between the plurality of plate-shaped members 61, the excess conductive paste 8 with which the respective grooves 611 are filled flows out of the grooves. Consequently, conductive paste 8 can remain along the side walls of the respective grooves 611 of the plurality of plate-shaped members 61.

What is claimed is:

1. A method of forming an external electrode of an electronic component having an element, the element having first and second faces opposed to each other, and third and fourth faces extending so as to connect the first and second faces and opposed to each other, comprising:

a preparatory step of preparing a jig having a groove capable of insertion of the element and filling an interior of the groove of the jig with a conductive paste:

a removal step of causing the conductive paste with which filling is performed to remain along at least first and second side faces opposed to each other and a bottom face of the groove, and removing residual conductive paste:

a step of holding the element to a holding member in a condition in which the fourth face is in contact with the holding member;

a first forming step of forming a first electrode portion on the first face of the element by inserting the element in the groove, moving the element such that the first face thereof approaches the first side face of the groove, bringing the first face of the element into contact with the first side face of the groove, and applying the conductive paste remaining on the first side face from a direction facing the first face, in the condition in which the fourth face is in contact with the holding member;

a second forming step of forming a second electrode portion on the second face of the element by moving the element such that the second face thereof approaches the second side face of the groove, bringing the second face of the element into contact with the second side face of the groove, and applying the conductive paste remaining on the second side face from a direction facing the second face, in the condition in which the fourth face is in contact with the holding member;

a third forming step of forming a third electrode portion after the first and second electrode portions are formed so as to connect the first electrode portion and the second electrode portion on the third face of the element by moving the element such that the third face thereof approaches the bottom face of the groove, bringing the third face of the element into contact with the bottom face of the groove, and applying the conductive paste remaining on the bottom face, in the condition in which the fourth face is in contact with the holding member; and an electrode forming step of forming an external electrode comprising the first electrode portion, the second electrode portion and the third electrode portion by drying the element.

2. The method of forming an external electrode according to claim 1, further comprising an intermediate processing step between the second forming step and the third forming step; wherein, the intermediate processing step of decreasing the fluidity of the conductive paste in the first electrode portion and the second electrode portion by drying the element.

3. The method of forming an external electrode according to claim 1 wherein in the first forming step, first electrode portions are formed juxtaposed in a plurality of locations on the first face and, in the second forming step, second electrode portions are formed in positions respectively corresponding to the first electrode portions formed juxtaposed in the plurality of locations and, in the third forming step, third electrode portions are formed so as to connect with the respective first electrode portions formed juxtaposed in the plurality of locations and so as to connect with the respective second electrode portions formed in the corresponding positions.

4. The method of forming an external electrode according to claim 3, further comprising:

in the preparatory step, the jig in which a plurality of plate-shaped members formed with grooves capable of insertion of the element are arranged alongside each other is prepared and the interior of the respective grooves is filled with the conductive paste so as to span and cover the respective grooves of the plurality of plate-shaped members; and in the removal step, the conductive paste introduced between the respective plurality of plate-shaped members is removed, to cause the conductive paste that is introduced into the respective grooves to remain along at least the first and second faces and the bottom face of the respective grooves.

* * * * *